United States Patent [19]

Willems et al.

[11] Patent Number: 5,309,006
[45] Date of Patent: May 3, 1994

[54] FET CROSSBAR SWITCH DEVICE PARTICULARLY USEFUL FOR MICROWAVE APPLICATIONS

[75] Inventors: David A. Willems, Salem; Victor E. Steel, Troutville, both of Va.

[73] Assignee: ITT Corporation, New York, N.Y.

[21] Appl. No.: 788,203

[22] Filed: Nov. 5, 1991

[51] Int. Cl.$^5$ .................................... H01L 29/78
[52] U.S. Cl. ................................ 257/275; 257/287
[58] Field of Search ............................ 257/275, 287

[56] References Cited

U.S. PATENT DOCUMENTS

| | | | |
|---|---|---|---|
| 3,643,139 | 2/1972 | Nienhuis | 257/401 |
| 4,048,646 | 9/1977 | Ogawa et al. | 257/275 |
| 4,737,837 | 4/1988 | Lee | 257/401 |
| 4,739,388 | 4/1988 | Packeiser | 257/275 |
| 4,962,050 | 10/1990 | Geissberger et al. | 257/275 |
| 4,994,868 | 2/1991 | Geissberger et al. | 257/287 |

Primary Examiner—Ngan Ngo
Assistant Examiner—Stephen D. Meier
Attorney, Agent, or Firm—Patrick M. Hogan; Arthur L. Plevy

[57] ABSTRACT

An FET crossbar switch device is implemented by using a split gate electrode and a shared source and drain pad to implement source and drain electrodes on an integrated circuit substrate. First and second inputs to the device are associated with first and second transmission lines, each of which is directly connected to a first and second source electrode areas. Disposed between the source electrode areas are respective drain electrode sections, each of which is coupled to an associated output transmission line. The input and output transmission lines are fabricated directly on the integrated circuit substrate. Gate fingers or electrodes are directed between respective drain electrodes and adjacent source electrodes. By properly biasing the gate electrodes, one can direct the first input to the first output with the second input directed to the second output. In a second state the first input can be connected to the second output with the second input disconnected or connected to the first output. In this manner, the device operates as a crossbar switch while providing extremely efficient operation at high microwave frequencies due to the symmetry of the device as employing transmission line geometry. The construction of the device reduces the need for matching networks. The entire device is implemented by microwave monolithic integrated circuit techniques and is extremely reliable and efficient.

20 Claims, 4 Drawing Sheets

FET CROSSBAR SWITCH DEVICE PARTICULARLY USEFUL FOR MICROWAVE APPLICATIONS

FIELD OF THE INVENTION

This invention relates to switching apparatus in general and, more particularly, to a crossbar switch device employing field effect transistor (FET) structures and particularly adapted for microwave applications.

Background of the Invention

As one can ascertain, switching is a basic function found in most electrical and electronic systems and can be accomplished by both mechanical and electronic means. One particular type of switch is designated as a crossbar switch. The crossbar switch contains two inputs and two outputs such that when an input is connected to either output, the other input is connected to the remaining output.

Referring to FIG. 1A, there is shown a first state of a crossbar switch where input A is connected to output 1 while input B is connected to output 2. FIG. 1B shows the other state of the switch where input A is connected to output 2 and input B is connected to output 1. The reason for the designation crossbar switch is immediately ascertained by referring to FIG. 1B whereby the connections between inputs and outputs cross each other. Thus, if the switch is implemented as a mechanical structure, the conductors physically cross as suggested by FIG. IB and therefore the switch is designated as a crossbar switch. Crossbar also has meaning in telephony where a crossbar switch basically is a matrix assembly. In any event, for purposes of this description the term crossbar will be used to specify a device which operates to provide the above-described states (FIG. 1A and FIG. 1B).

Electronic switches are typically used when small size and high switching speeds are required. At microwave frequencies PIN diodes or FETs are used as switching elements. Basically, the high power handling capability of the PIN diode has made this device a first choice for most microwave switching circuits as well as for power limiters where ultimate switching speed is not necessary.

As one can ascertain, the most desirable switch would be one that exhibits a short circuit on the forward bias and an open circuit on the reverse bias. Because of the diode junction capacitance, parasitic package reactance and mount reactance, it is more optimum to think of the PIN diode switch as a device that provides two different reactances for two bias states. In any event, the PIN diode has been utilized in conjunction with transmission lines and in various other embodiments to provide switching functions for microwave frequency applications and, as such, one can utilize the PIN diode to provide single pole, double throw switching and other embodiments as well. There are problems in utilizing PIN diodes at microwave frequencies both in design complexity and cost.

The field effect transistor (FET) has been widely employed in microwave switching applications. The standard form of any series switching circuit using any normal semiconductor device has several possible faults, even if it is the simpler silicon MOSFET or FET that is used as a switch. These faults are that such devices have a finite Switch-On resistance. They have incomplete isolation of input and output in the Off state and the coupling of the clock waveform to the sampled or switched input signal can also occur. FET devices, both as MOSFETs, MESFETs, and other devices are also widely employed. Such devices make excellent switches and choppers for many applications such as modulators, demodulators, sample and hold circuits, and so on. One advantage is that there is no inherent offset voltage associated with MOSFETs as there is with two-junction transistors since the conduction path between drain and source is predominantly resistive. That is, the conduction channel is either depleted or enhanced by controlling an induced field and therefore such devices provide good characteristics at high frequency.

The DC gate input impedance of a MOSFET is also extremely high and requires little power, since the gate is essentially a capacitor. The impedance is determined by the properties of the insulation layer of the gate. Another important advantage of MOS devices used as switches is the exceptionally high ratio of Off resistance to On resistance of the drain source channel. The resistance can be as low as about 50 Ohms in the On condition, and higher than thousands of Megohms in the Off condition. The main disadvantage of such devices is the capacitance between the gate and the drain and the gate and the source. This capacitance feeds through part of the gate control voltage to the signal path and is detrimental to high frequency isolation. As indicated, such devices are widely employed as switches. Thus, the implementation of a crossbar switch for the operation as shown in FIGS. 1A and 1B has been implemented by FET devices as shown in FIG. 1C. The prior art utilized four FET devices as 10, 12, 13 and 14 arranged between the input terminals A and B and output terminals 1 and 2. As one can see by referring to FIG. 1C, in the first state FETs 10 and 14 are biased On to provide a conduction path between input A and output 1 and between input B and output 2 with FETs 12 and 13 biased in the Off condition. Biasing voltages are typically and conventionally applied to the gate electrodes (G) with polarity determined by the type of device as an n or p type device. In the state shown in FIG. 1B, FETs 12 and 13 are turned On with FETs 10 and 14 biased Off. At low frequencies where the size of the FETs and the connecting circuitry is much less than a wavelength, the use of individual FETs as 10, 12, 13 and 14 provides a reasonable approach. However, at microwave frequencies both the physical size of the FETs and the length at the conductors which connects the FETs degrades circuit performance. Also as shown in FIG. 1C, a minimum of four FETs as separate devices such as MOSFETs or MESFETs are required.

It is an object of the present invention to provide an improved microwave crossbar switch device employing a unique FET structure which employs a split gate and shared source and drain pads.

A further object of the present invention is to provide an improved crossbar switching device which enables one to use transmission line geometries. Such construction employing FETs eases the need for matching networks and the entire switch device lends itself to being fabricated with microwave monolithic integrated circuits (MMICs).

SUMMARY OF THE INVENTION

A crossbar switching device, comprising a semiconductor substrate having located thereon first and second FET source electrode areas, each of a relatively rectangular surface configuration and located on said substrate parallel to one another and spaced apart from each other; first and second FET drain electrode areas, each of a relatively rectangular surface configuration and positioned between said source electrodes, with said first drain electrode extending a predetermined distance between said source electrodes from a top side towards a bottom side, with said second drain electrode extending said predetermined distance between said source electrodes from a bottom side towards said top side, with said first and second drain electrodes as located between said source electrodes disposed about the same center line and parallel to said source electrodes, with each of said source electrodes spaced from said drain electrodes to form a FET channel; first, second, third and fourth gate finger electrodes each of a given length and width and each located on said substrate and each adapted to receive an operating bias, with said first gate electrode located between said first source and said first drain, with said second gate electrode located between said first drain and said second source, with said third gate electrode located between said first source and said second drain, with said fourth gate electrode located between said second source and said second drain, wherein a bias applied to a selected gate electrode will cause said FET channel to provide a low impedance path between a source electrode and a drain electrode; a first transmission line located on said substrate and connected to said first source electrode area and adapted to receive a first input signal; a second transmission line located on said substrate and connected to said second source electrode and adapted to receive a second input signal; and biasing means coupled to said gate electrodes to selectively operate said gate electrodes, wherein when said first gate electrode operates to cause said first input signal to couple to said first drain, with said fourth gate electrode operative to cause said second input signal to couple to said second drain in said first state, and in a second state said third gate electrode operates to cause said first signal to couple to said second drain, with said second gate electrode operative to cause said second signal to couple to said first drain thereby causing said device to operate as a crossbar switch.

DETAILED DESCRIPTION OF THE FIGURES

Figure 1A:
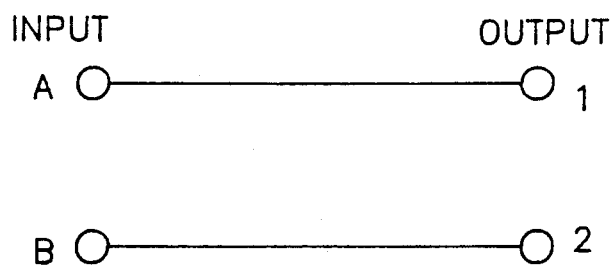
FIGS. 1A, 1B, 1C are figures showing the states of a typical crossbar switch according to this invention, with FIG. 1C showing a typical prior art construction as described above.
Figure 1B:
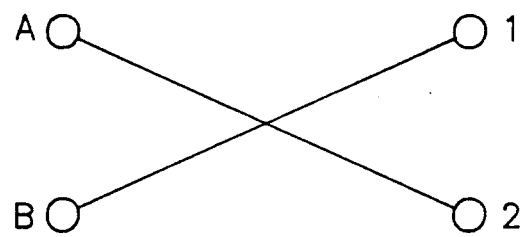

As indicated in the Background of the Invention, FIG. 1A depicts the first state of a crossbar switch where input A is connected to output 1 and input B is connected to output 2. FIG. 1B shows the other state of the crossbar switch where input A is connected to output 2 and input B is connected to output 1.

Figure 1C:
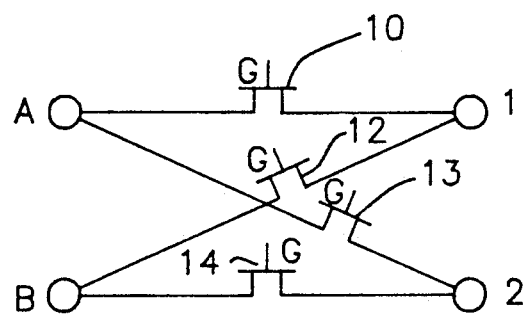

FIG. 1C shows four FETs, namely, 10, 12. 13 and 14 arranged between input terminals A and B and output terminals 1 or 2 and whereby if selected gate electrodes (G) of the FETs are properly biased, then the states depicted in FIGS. 1A and 1B can be implemented by the circuit shown in FIG. 1C.

Figure 2:
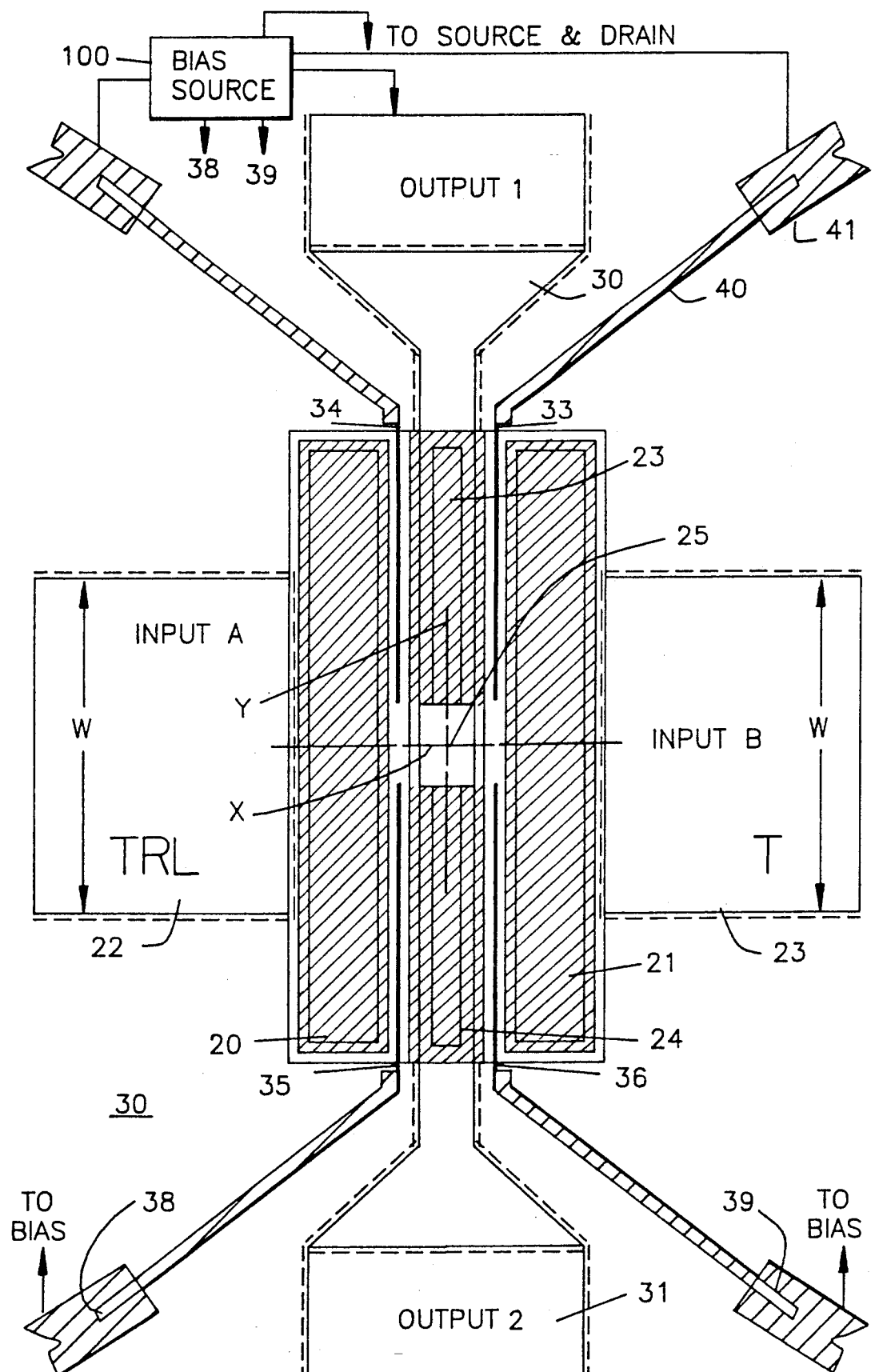
FIG. 2 is a top planar view of an FET crossbar switching device according to this invention.

Referring to FIG. 2 there is shown a top plan view of a crossbar switch device employing FET structures and utilizing gate finger or gate electrode structures for control of the crossbar switch and the FETs according to the layout depicted in FIG. 2.

Before proceeding with a detailed description of the operation of the switching device shown in FIG. 2, it is indicated that the fabrication of the FET structures as shown in FIG. 2 is implemented by well known techniques. FET devices are utilized in microwave applications, as they are capable of high frequency operation. The fabrication of FET devices including source electrodes, gate electrodes and drain electrodes which are applicable for microwave operation is well known and there are many versions of both MOSFETs and MESFETs which can be employed to implement the crossbar switching arrangement shown in FIG. 2. Basically, as is well known, FETs which are utilized in microwave applications are fabricated by the use of gallium arsenide (GaAs). Gallium arsenide FETs consist of a conducting channel whose thickness is controlled by the depth of the depletion region under the gate electrode, and consequently by the gate voltage with respect to the channel. On n type gallium arsenide layers, the surface depletion region can be easily implemented with a Schottky gate (n-MESFET) or a p-type GaAs gate (n-JFET). Basically as one knows, the active channel spreads from source to drain and is squeezed between the surface depletion region (including that of the gate), and the interface depletion region at the interface between a semi-insulating substrate and the channel. Mid-bandgap traps, which are required to make GaAs substrates semi-insulating control the low frequency response of these depletion regions.

As indicated above, the fabrication of gallium arsenide FET devices as well as FET devices in general is widely known. Furthermore, the devices depicted in FIG. 2 can be made according to the techniques taught in U.S. Pat. Nos. 4,962,050 entitled GALLIUM ARSENIDE FET MANUFACTURING PROCESS EMPLOYING CHANNEL CONFINING LAYERS, patented on Oct. 9, 1990 to A. E. Geissberger et al. and assigned to the assignee herein. See also U.S. Pat. No. 4,994,868 entitled HETEROJUNCTION CONFINED CHANNEL FET, issued on Feb. 19, 1991 to A. E. Geissberger et al. and assigned to ITT Corporation. The patents describe high speed gallium arsenide FETs which are formed by fabricating a sandwich gallium arsenide channel between AlGaAs layers and employing a silicon (Si) implant to provide channel doping for the gallium arsenide channel.

Again, referring to FIG. 2 there is shown an FET crossbar switch device according to one embodiment of this invention. As shown in FIG. 2, input A and input B are associated with separate FET source electrode areas such as source electrodes 20 and 21. Each source electrode area 20, 21 is typically rectangular in top configuration with sidewalls of a given length and width. The term source electrode and drain electrode area are interchangeable as is known in the FET art. Hence, source and drain can be interchanged. Each source area 20 and 21 have the corresponding sides parallel to one another and spaced apart as shown. Input A is associated with a first transmission line 22 with input B associated with a transmission line 220. The transmission lines 22 and 220 are fabricated from a good conductive material as utilized in gallium arsenide technology and are deposited or otherwise fabricated and located on the GaAs substrate 30. Essentially, the transmission lines 22 an 220 are directly connected to an associated source electrodes 20 and 21 of the crossbar FET switching device. The transmission lines are conventionally fabricated from a good conductive metal material such as gold, platinum, copper or silver and fabricated on the gallium arsenide semi-insulating substrate by means of a conventional metallization technique such as RF sputtering, evaporation, and so on. The source electrode areas or the source pads 20 and 21 are fabricated on the gallium arsenide substrate by conventional techniques.

Interposed between the source electrodes are drain electrode areas designated by reference numerals 23 and 24. The drain electrodes are formed by conventional techniques and are essentially elongated, rectangular areas which are interposed or located intermediate between the source electrode areas 20 and 21. Each of the drain electrodes 23 and 24 are isolated from each other by means of an isolation layer or region 25. The isolation region 25 can be fabricated on the gallium arsenide substrate by many well known techniques. For example, an isolation layer is provided by having a given doping level which contacts the insulator surface of the substrate. In a similar manner, the isolation region 25 may constitute the actual substrate without any of the drain electrodes formed thereon. Each of the drain electrode sections, such as 23 and 24, is associated with a transmission lines 30 and 31. The transmission line 30 represents a first output as output 1 which is directly connected to the drain electrode area or drain portion 23. The output transmission line 30 as seen is tapered at the input connecting end and basically has the same dimension at the rectangular portion as transmission lines 22 and 220. The output 2 is manifested by the output transmission line 31 which again has a tapered input portion and a reduced area section to firmly connect to the associated drain electrode area 24. As seen, both the source electrodes 20 and 21 and drain electrode areas 23 and 24 each share the same pad. Thus there is a shared source pad and a shared drain pad provided on the integrated circuit substrate which, as indicated, is a gallium arsenide substrate 30. Located between each source and drain electrode are conductive fingers or gate electrodes as 33, 34, 35 and 36. The gate electrodes, or gate fingers, extend between one side of each source electrode and one side of the associated drain electrode. As one can see from FIG. 2, a gate electrode or gate finger 33 is positioned between the drain electrode section 23 and the source electrode section 21 as associated with the input B. In a similar manner, the gate electrode 34 is a metallic finger which extends between a portion of the source electrode 20 and the drain electrode 23. A similar metallic gate electrode or finger 35 extends between a portion of the source electrode 20 and the drain electrode 24. Another metallic finger or gate electrode 36 extends and is positioned between the drain electrode 24 and the source electrode 21. As seen, each metallic finger is connected to a terminal path, such as 40, associated with metallic finger 33 which is connected to a suitable biasing terminal 41. The metallic paths 40 as well as the terminal land area 41 are fabricated from conventional conductive materials such as platinum, silver, copper, gold, or alloys thereof deposited by conventional metallization techniques. In this manner a suitable bias voltage can be applied to each of the pads to bias the gate electrodes either in an On or Off condition as well as the source and drain. Shown in FIG. 2 is a bias source 100, which operates to bias the device. The FET structures shown can be implemented by depletion FET devices where the gates turn off based on a negative voltage which is applied with respect to the substrate. In any event, there are different types of FETs that can be conventionally fabricated.

As one can see from the geometric construction in FIG. 2, the FET device fabricated operates equivalent to the circuit shown in FIG. 1C. In this manner, the input A is connected to the source electrode 20, by biasing the metallic finger 34 in the On condition. Input A is thus connected to drain 23 and hence to transmission line 30 (output 1). In a similar manner, by biasing metallic gate electrode 36 in the On condition, input B is coupled to source electrode 21 and propagates in the output transmission line 31 via the drain 24. In this state which is representative of the state shown in FIG. 1A, input A is connected to output 1 and input B is connected to output 2. The other two gate electrodes, which are gate electrodes 33 and 35, are biased in the Off condition.

In order to provide the state shown in FIG. 1B, the following operation occurs. The metallic gate 35 is biased in the On condition to cause the signal (input A) on transmission line 22 to propagate from the source electrode 20 to the drain electrode 24 and therefore to transmission output line 31 (output 2). The signal applied to transmission line 220, which is input B, propagates from source electrode 21 to drain electrode 23 which is connected to the output transmission line 30 by biasing finger 33 with an On voltage. Both gate electrodes as 36 and 34 are biased in the Off state in order to achieve the state condition shown in FIG. 1B.

As one can ascertain, when the gates are biased On, a low impedance path is formed across the associated FET channel and when the gates are biased Off, a high impedance or isolation between the drain and source electrode is provided by the channel which blocks the signal. It is, of course, understood from the device of FIG. 2, that an option exists so that only one section of the FET device can be turned on at any one time; thus isolating all other ports. In this manner, for example, the signal on transmission line 22 designated as input A can be caused to propagate to output 1 or output 2 without propagating any signal from input B or transmission line 220 to any of the output lines. This is just a matter of applying the correct bias voltage to an associated pad of each of the gate electrodes or gate fingers as 33, 34, 35 and 36. At high frequencies, line lengths which are the lengths associated with each individual lead or area begin to appear as reactive elements. Thus, a typical line such as, for example, conductor 40 or gate electrode 33 behaves as a capacitor or inductance at high frequencies. In the circuit configuration shown in FIG. 2, one substantially eliminates the line lengths by placing all of the circuit components one above the other, utilizing conventional FET integrated circuit technology. Thus, as shown in FIG. 2, transmission lines as 22 and 220 are connected to each of the source electrode areas as 20 and 21 and form together with those areas a transmission line geometry which can be accurately configured. In this way one eliminates the need for matching circuits. In a similar manner, the output transmission lines 30 and 31 together with their associated tapers are matched to the drain electrode areas as 23 and 24 and thus operate together therewith as a transmission line geometry which accommodates the correct impedance levels and thus effectively eliminates the capacitive and parasitic inductive effects of such devices at high frequencies. As seen in FIG. 2, the device is completely symmetrically disposed about both the X and Y axes shown. Thus all capacitances, inductances, RF leakages, etc. are symmetrically distributed, further enhancing device operation and fabrication. In such a device, the gallium arsenide substrate is properly treated according to conventional techniques with the transmission lines 22, 220, 30 and 31 consisting of gold or another conductive material suitably deposited on the substrate 30. The input transmission lines are approximately 88 microns wide (W) using a gallium arsenide substrate of approximately 125 microns thick. Each of the gate fingers as, for example, 33, 34, 35 and 36 are approximately 50 microns to 600 microns in length being approximately between 0.1 to 2.0 microns thick. The source electrodes as areas 20 and 21 basically can be narrower than, or wider than, the width of the transmission lines but typically can vary between 80 to 150 microns. When the drain electrodes are rectangular they have a length of 20–70 microns and a width of 5–15 microns. The drain electrodes 23 and 24, as shown, have an isolation area which may be between 10 to 25 microns with the drains symmetrically disposed on each side of the associated source electrodes 20 and 21. When rectangular the source electrodes have a length of 30–150 microns and a width of 5–25 microns. The fingers or gate electrodes 33, 34, 35 and 36 can extend along the entire length of the drain electrodes or may extend partially along the length thereof.

Typically, the gate electrodes of switching FETs are symmetrically placed between the source and the drain. In this manner the source and the drain electrode can be used interchangeably. Typically, the gate electrodes or gate fingers are fabricated from a refractory metal, depending on the FET processing technique employed. Such metals, for example, may include titanium, palladium and other refractory metals or alloys thereof. Construction and fabrication can be had by reference to the above-noted patents which describe suitable devices. Such devices are designated as self-aligned gate devices and have been described in the above-noted patents as well as in their literature. For additional information on the fabrication of such devices, reference is made to a text entitled "Gallium Arsenide Integrated Circuits Design and Technology" by J. Mun, published by MacMillan Publishing Company, New York (1988). This text basically describes the fabrication of gallium arsenide integrated circuits including FET devices.

Figure 3:
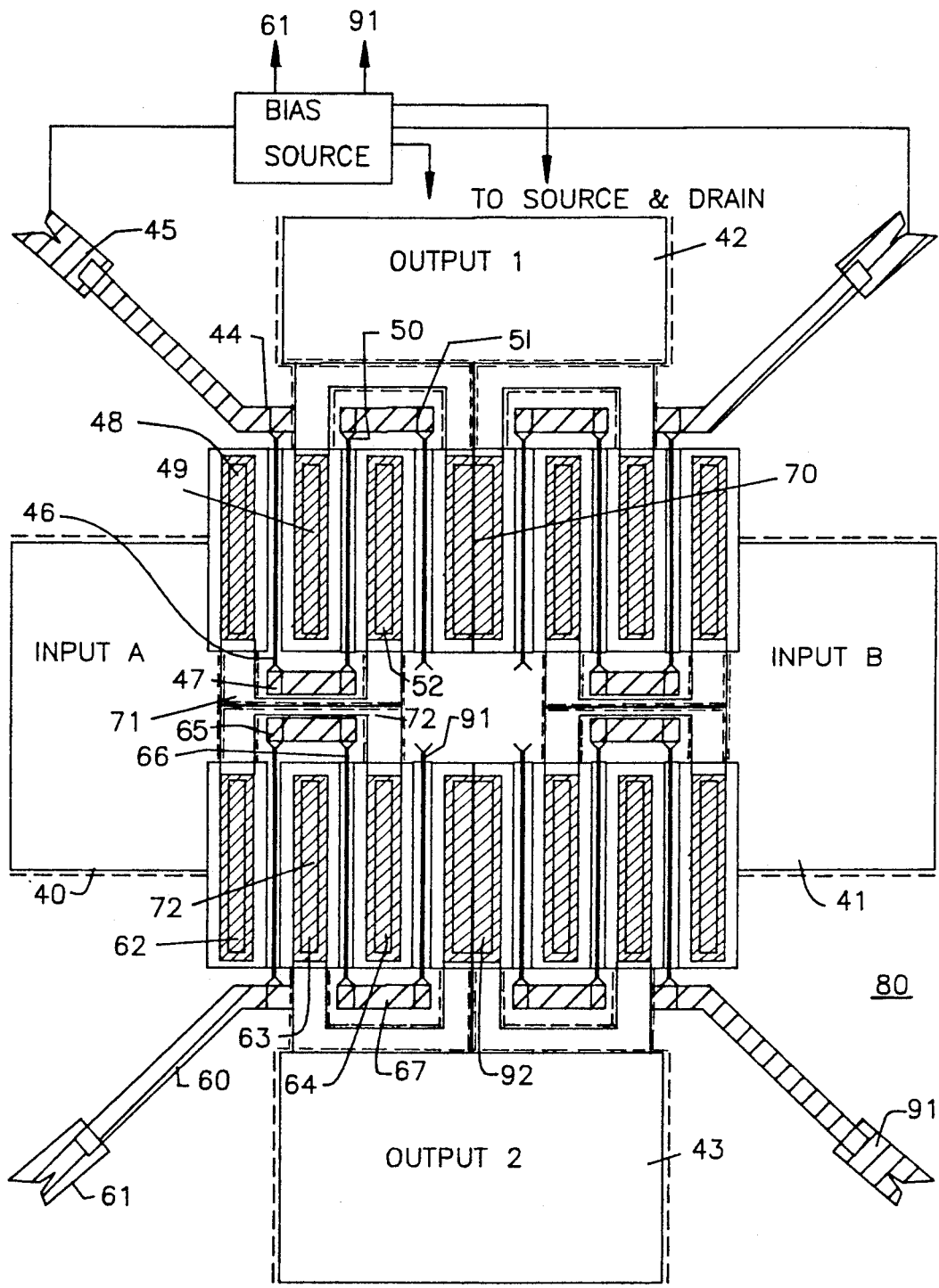
FIG. 3 is a top planar view of an alternate embodiment of a crossbar FET switching device according to this invention.

Referring to FIG. 3, there is shown a multi-finger or multi-gate electrode implementation of the crossbar switch employing multiple FET structures. Again referring to FIG. 3, there is shown a top plan view. It is again indicated that all components depicted in FIG. 3 are fabricated by conventional, well known, state of the art FET fabrication techniques. The entire device is fabricated on a substrate 80 of gallium arsenide. As one can see, there is an input transmission line 40 which again is fabricated from a conductive material. In any event, the input transmission line 40 is directly connected to the top source electrode areas 48 and 52 by means of the upper U-shaped end section of the transmission line, which U-shaped section is designated by reference numeral 71. In a similar manner, the input transmission line 40 is also connected to the bottom source electrode areas 62 and 64 by means of the lower U-shaped end section 72 of the transmission line 40. It is noted that transmission line 40 is completely symmetrical and is essentially fabricated by a single metallization process with the U-shaped ends 71 and 72 being integrally formed and which U-shaped ends contact the source electrode areas 62 and 64 as well as source electrode areas 48 and 52. Interposed between source electrodes 48 and 52 is a drain electrode area 49. Interposed between source electrode areas 62 and 63 is a drain electrode area 72. As one can see, the drain electrode area 49 is connected to output transmission line 42 while the drain electrode area 72 is connected to output transmission line 43. Each of the drain and source electrodes have gate fingers as 64, which gate finger or gate electrode 64 is coupled to a metallized lead 60 which terminates in a metallized contact or land area 61. The finger 64 is directed between source electrode 62 and drain electrode 72 and essentially is connected to a connecting or conductive land area 65 which is connected to another finger electrode segment 66 which is directed between drain electrode 72 and the other source electrode area 63. The finger 66 extends to a contact area 67 which, again, is connected to another gate electrode 91 which is directed between source electrode 64 and a central drain electrode 92. As one can see, the configuration described is repeated in the top and bottom sections of the substrate. Essentially, multiple source and drain electrodes are associated with reduced length gate electrodes and reduced length fingers. These gate finger electrodes, as indicated above, are directed between source and drain electrodes and essentially each of the drain electrode areas such as 49 and 70, and so on, are connected at the top end to the output transmission line designated as 42. At the other end the output transmission line designated as 43 is connected to drain electrode areas such as 63 and 92 while the input transmission line 40 is connected to source areas such as 48 and 52 on the top, and connected to source areas such as 62 and 64 at the bottom. The input transmission line 41 is similarly connected. As one can see from FIG. 3, the entire implementation is completely symmetrical about the X and Y axes. The individual source areas as 48 and 52 and 62 and 64 are smaller rectangular areas connected in parallel as are the drain electrodes. In this manner the effective length of each of the gate fingers is substantially reduced but essentially is a segmented or step type of configuration whereby the gate electrode instead of being linearly elongated as shown, for example, in FIG. 2, is substantially of the same effective length but is folded or segmented. In this manner the entire size of a crossbar switch can be substantially reduced. Larger gate widths will decrease the insertion loss while also decreasing the isolation. The smaller size depicted by the configuration shown in FIG. 3 decreases parasitics in the structure which allows for better performance at high frequency.

Figure 4:
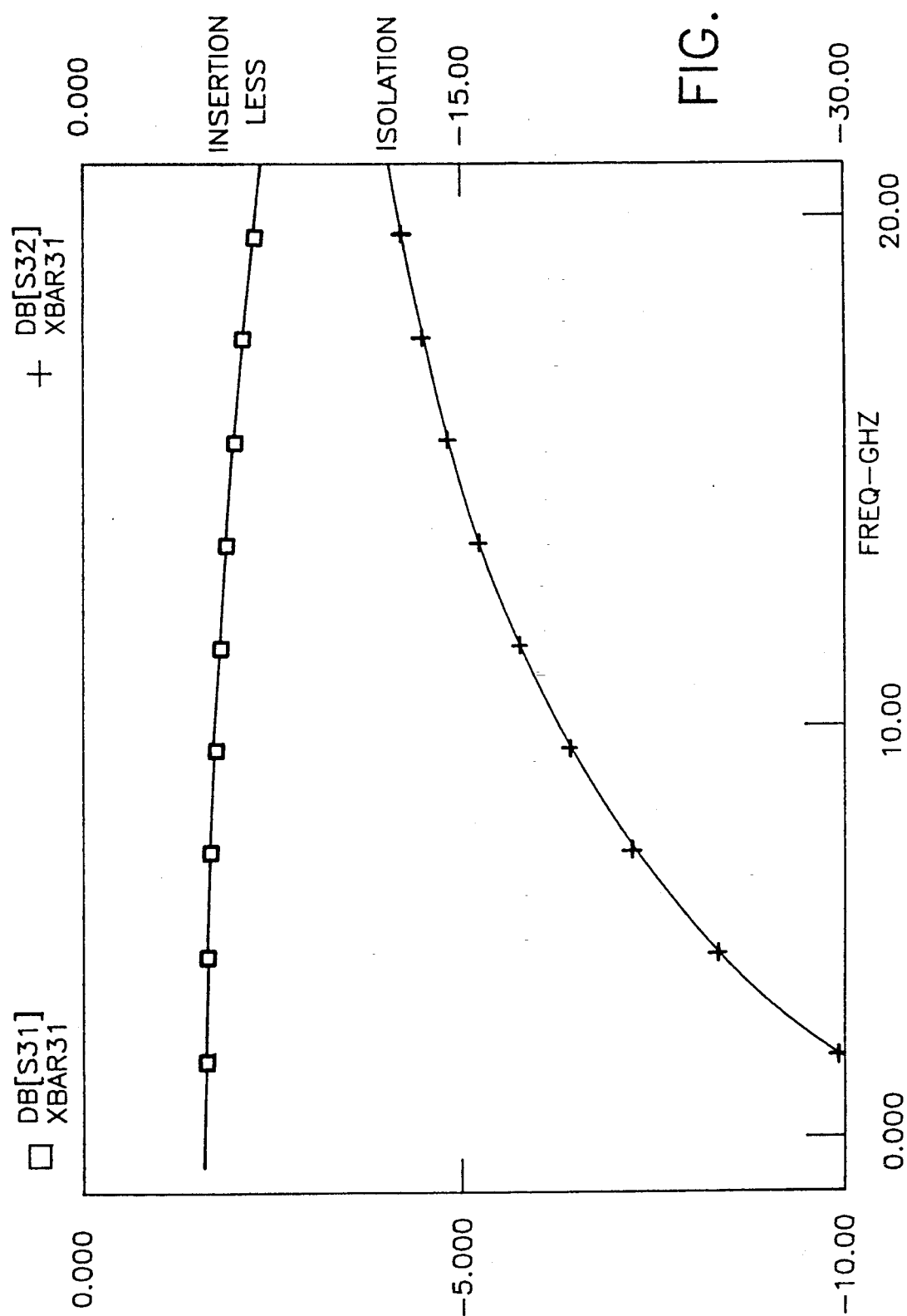
FIG. 4 is a graph depicting certain performance characteristics of the devices shown in FIGS. 2 and 3.

Referring to FIG. 4, there is shown a graph depicting typical performance of the type of devices shown in FIGS. 2 and 3. It is seen that the frequency range depicted is from 0 to 20 GHz. The illustrated effective operating range is from 10 to 20 GHz. It is seen the insertion loss of the device is less than 2.5 dB with an isolation of 15 dB at 20 GHz. The insertion loss and the isolation are drawn as separate curves in FIG. 4. The above-noted performance characteristics depict an extremely efficient microwave device or crossbar switch device operable at very high microwave frequencies.

The invention allows the implementation of the crossbar switching function as indicated utilizing transmission line geometries which therefore eases the need for matching networks at both input and output ports. The invention as described lends itself to application with microwave monolithic integrated circuits (MMICs), while providing for extremely reliable operation in implementing crossbar switching functions. It is understood that many other switch configurations can be implemented using the above device techniques, such as NxM switches where N and M are positive integers.

We claim:

1. A crossbar switching device, comprising:
   a semiconductor substrate having located thereon first and second FET source electrode areas, each of a relatively rectangular surface configuration and located on said substrate parallel to one another and spaced apart from each other;
   first and second FET drain electrode areas, each of a relatively rectangular surface configuration and linearly positioned between said source electrodes, with said first drain electrode extending a predetermined distance between said source electrodes from a top side towards a bottom side, with said second drain electrode extending said predetermined distance between said source electrodes from a bottom side towards said top side, with said first and second drain electrodes as located between said source electrodes disposed about a common center line and parallel to said source electrodes, with each of said source electrodes spaced room said drain electrodes to form an FET channel;
   first, second, third and fourth gate finger electrodes each of a given length and width and each located on said substrate and each adapted to receive an operating bias, with said first gate electrode located between said first source and said first drain, with said second gate electrode located between said first drain and said second source, with said third gate electrode located between said first drain and said second drain, with said fourth gate electrode located between said second source and said second drain, wherein a bias applied to a selected gate electrode will cause said FET channel to provide a low impedance path between a source electrode and a drain electrode;
   a first transmission line located on said substrate and connected to said first source electrode area and adapted to receive a first input signal;
   a second transmission line located on said substrate and connected to said second source electrode and adapted to receive a second input signal; and
   wherein a biasing signal applied to said first gate electrode operates to cause said first input signal to couple to said first drain, with a biasing signal applied to said fourth gate electrode operative to cause said second input signal to couple to said second drain in a first state, and in a second state, a biasing signal applied to said third gate electrode operates to cause said first signal to couple to said second drain, with a biasing signal applied to said second gate electrode operative to cause said second signal to couple to said first drain thereby causing said device to operate as a crossbar switch.

2. The device according to claim 1, further including:
   third and fourth transmission lines located on said substrate with said third line connected to said first drain electrode and with said fourth line coupled to said second drain electrode.

3. The device according to claim 2, wherein said third and fourth transmission lines each have an input tapered end connected to said associated drain electrode and each input end extending into a planar section.

4. The device according to claim 3, wherein said transmission lines are striplines formed on said substrate by the deposition on said substrate of a highly conductive metal.

5. The device according to claim 1, wherein said device is completely symmetrical about vertical and horizontal center lines of said device.

6. The device according to claim 5, wherein each gate electrode is formed from a refractory metal and with each gate electrode connected to a terminal area adapted to receive an operating bias.

7. The device according to claim 1, wherein each separate source electrode includes at least an even number of rectangular source areas, parallel to each other and electrically connected to each other in parallel and spaced apart from each other, each to accommodate a drain electrode between said source areas, and including a segmented gate electrode located between said drain electrode and said rectangular source areas.

8. The device according to claim 1, wherein said substrate is GaAs.

9. The device according to claim 1, wherein said FET source, drain and gate electrodes are MOSFET devices.

10. The device according to claim 9, wherein said MOSFETs are of the depletion type.

11. The device according to claim 1, wherein said microwave frequencies are from 1.0 to 100 GHz.

12. The device according to claim 11, having an insertion loss of less than 2.5 db with an isolation of about 15 db at a frequency of 20 GHz for said input signals.

13. The device according to claim 1, wherein said gate electrode fingers are fabricated from titanium or palladium or alloys thereof.

14. The device according to claim 1, wherein said transmission lines are stripline metal depositions selected from platinum, copper, silver or gold or alloys thereof.

15. The device according to claim 1, wherein said FET source, drain and gate electrodes are MESFET devices.

16. The device according to claim 15, wherein said MESFETs are of the depletion type.

17. The device according to claim 1, wherein said source electrodes are rectangular, having a long side or length between 30 to 150 microns, a width of between 5 to 25 microns, with said drain electrode of a length between 20 to 70 microns and a width of between 5 to 15 microns.

18. The device according to claim 17, wherein a gate electrode finger is between 0.1 to 2.0 microns wide.

19. The device according to claim 18, wherein each transmission line has a width of about 90 microns.

20. The device according to claim 19, wherein said GaAs substrate is between 100 to 150 microns thick.

* * * * *

UNITED STATES PATENT AND TRADEMARK OFFICE
CERTIFICATE OF CORRECTION

PATENT NO. : 5,309,006
DATED : May 3, 1994
INVENTOR(S) : David A. Willems, et al It is certified that error appears in the above-indentified patent and that said Letters Patent is hereby corrected as shown below:

Column 9, line 34, please delete "room" (first word) and insert —from—.

Signed and Sealed this

Second Day of August, 1994

Attest:

BRUCE LEHMAN

Attesting Officer   Commissioner of Patents and Trademarks